United States Patent
Kawaguchi et al.

(10) Patent No.: US 12,227,843 B2
(45) Date of Patent: Feb. 18, 2025

(54) FILM FORMING METHOD AND TUNGSTEN FILM

(71) Applicant: TOKYO ELECTRON LIMITED, Tokyo (JP)

(72) Inventors: Takuya Kawaguchi, Yamanashi (JP); Takanobu Hotta, Yamanashi (JP); Hideaki Yamasaki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 54 days.

(21) Appl. No.: 18/096,365

(22) Filed: Jan. 12, 2023

(65) Prior Publication Data

US 2023/0227976 A1 Jul. 20, 2023

(30) Foreign Application Priority Data

Jan. 19, 2022 (JP) ................. 2022-006205

(51) Int. Cl.
*C23C 16/455* (2006.01)
*C23C 16/02* (2006.01)
*C23C 16/08* (2006.01)

(52) U.S. Cl.
CPC .... *C23C 16/45553* (2013.01); *C23C 16/0209* (2013.01); *C23C 16/08* (2013.01); *C23C 16/45559* (2013.01)

(58) Field of Classification Search
CPC .............................. C23C 16/4404
See application file for complete search history.

(56) References Cited

U.S. PATENT DOCUMENTS

| | | | |
|---|---|---|---|
| 10,026,616 B2 | 7/2018 | Suzuki et al. | |
| 10,400,330 B2 | 9/2019 | Suzuki et al. | |
| 11,532,509 B2 | 12/2022 | Wu et al. | |
| 2004/0161883 A1* | 8/2004 | Colombo | H01L 21/02255 |
| | | | 257/E21.01 |
| 2016/0351402 A1 | 12/2016 | Suzuki et al. | |
| 2016/0379879 A1* | 12/2016 | Hotta | C23C 16/45527 |
| | | | 438/656 |
| 2017/0110375 A1* | 4/2017 | Bao | H01L 21/823821 |
| 2017/0283942 A1 | 10/2017 | Suzuki et al. | |
| 2021/0242081 A1* | 8/2021 | Wu | H01L 29/785 |

FOREIGN PATENT DOCUMENTS

| | | |
|---|---|---|
| JP | H11-307480 A | 11/1999 |
| KR | 10-2016-0140398 A | 12/2016 |
| KR | 10-2017-0114932 A | 10/2017 |
| KR | 10-2021-0098308 A | 8/2021 |
| WO | WO 2015/080058 A1 | 6/2015 |

* cited by examiner

*Primary Examiner* — Robert A Vetere
(74) *Attorney, Agent, or Firm* — Fenwick & West LLP

(57) ABSTRACT

There is provided a film forming method for forming a tungsten film, comprising: preparing a substrate; and forming a tungsten film on the substrate. A chlorine-containing tungsten film whose film stress is adjusted by chlorine concentration in the film is formed as at least a part of the tungsten film.

17 Claims, 10 Drawing Sheets

FIG.3A  FIG.3B  FIG.3C
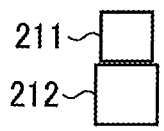 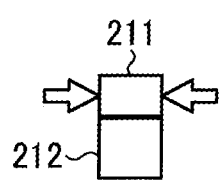 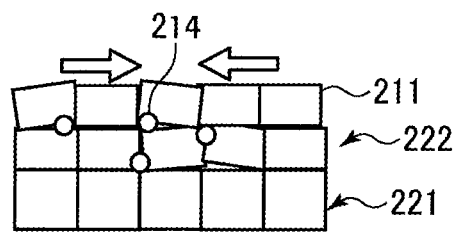
FIG.4A  FIG.4B  FIG.4C
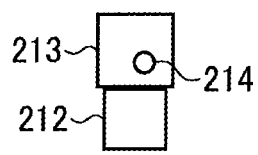 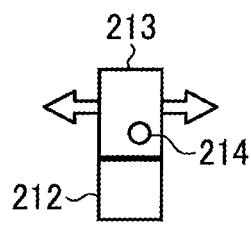 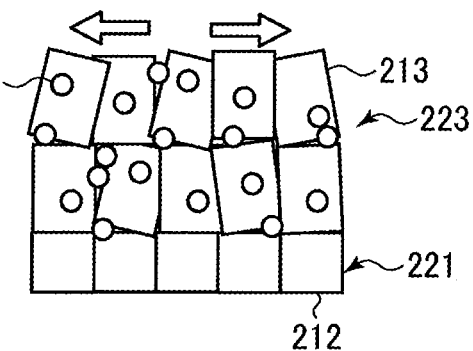

FILM FORMING METHOD AND TUNGSTEN FILM

CROSS-REFERENCE TO RELATED APPLICATIONS

This application claims priority to Japanese Patent Application No. 2022-006205 filed on Jan. 19, 2022, the entire contents of which are incorporated herein by reference.

TECHNICAL FIELD

The present disclosure relates to a film forming method and a tungsten film.

BACKGROUND

In a semiconductor manufacturing process, tungsten is used as a material for filling a contact hole formed on a substrate (semiconductor wafer) or a via hole between wirings and as a material for an interdiffusion barrier.

As a method for forming a tungsten film, a method for forming a film by a CVD method using a raw material gas, for example, tungsten hexafluoride ($WF_6$) and a reducing gas is known. Patent Document 1 discloses that in the case of forming a blanket tungsten film using $WF_6$, a tensile stress of the film increases when temperature of a substrate drops to a low temperature of about 400° C. Patent Document 1 also discloses that pre-processing is performed with a mixed gas in which $WF_6$ and monosilane are mixed at a predetermined ratio in order to solve the above problem.

Meanwhile, in recent years, since design rules have become more and more detailed and there is concern about adverse effects on devices due to raw materials containing fluorine, a technique for forming a tungsten film by a CVD method or an ALD method using tungsten chloride as a raw material gas has also been proposed (for example, Patent Document 2).

PRIOR ART DOCUMENTS

Patent Documents

Patent Document 1: Japanese Laid-open Patent Publication No. H11-307480
Patent Document 2: International Publication No. WO 2015/080058

SUMMARY

The present disclosure provides a film forming method capable of easily obtaining a tungsten film with reduced film stress and a tungsten film.

In accordance with an aspect of the present disclosure, there is provided a film forming method for forming a tungsten film, comprising: preparing a substrate; and forming a tungsten film on the substrate. A chlorine-containing tungsten film whose film stress is adjusted by chlorine concentration in the film is formed as at least a part of the tungsten film.

BRIEF DESCRIPTION OF THE DRAWINGS

The objects and features of the present disclosure will become apparent from the following description of embodiments, given in conjunction with the accompanying drawings, in which:

FIGS. 3A to 3C are diagrams showing a model for explaining mechanism by which a tungsten film has a tensile stress:
FIGS. 4A to 4C are diagrams showing a model for explaining mechanism by which the tensile stress of the tungsten film containing a large amount of chlorine of 4 at % or more is reduced.

DETAILED DESCRIPTION

Hereinafter, embodiments will be described with reference to the accompanying drawings.

<Overview>

Figure 1:
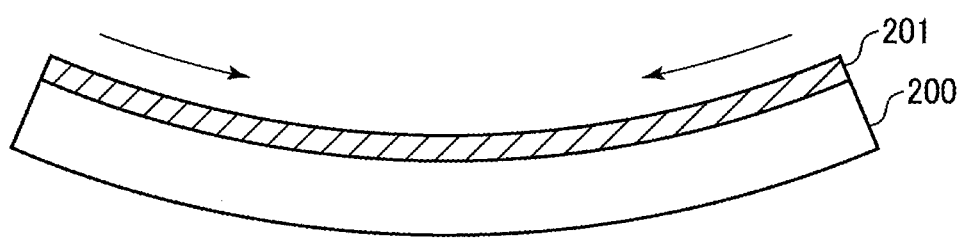
FIG. 1 is a cross-sectional view schematically showing a state in which a substrate is warped due to a tensile stress of a tungsten film.

A tungsten film generally has a tensile stress. The tensile stress of the tungsten film has a high value according to a film thickness. Therefore, as shown in FIG. 1, when a tungsten film 201 is formed on a substrate 200 such as a semiconductor wafer, the substrate 200 may warp due to its tensile stress. Further, film peeling may occur in the tungsten film 201. If the wafer 200 is warped, there is a possibility that troubles such as abnormal transfer or out-of-focus during exposure may occur, and the film peeling may cause particles.

Figure 2:
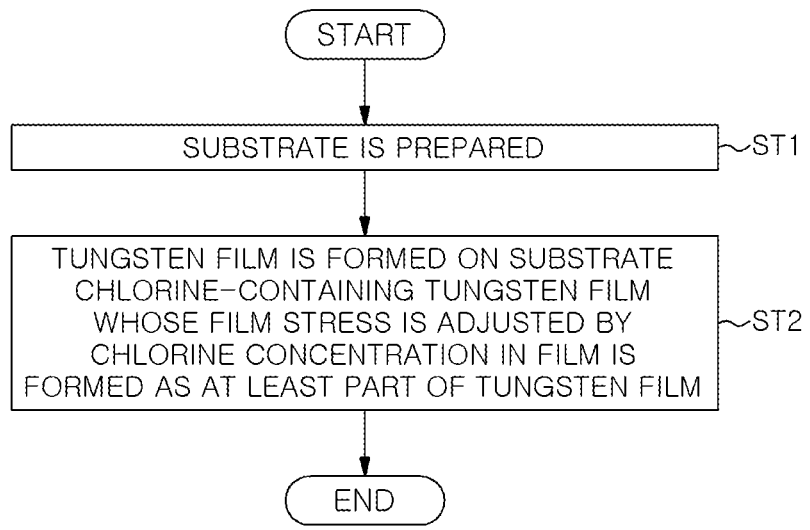
FIG. 2 is a flowchart showing a film forming method according to one embodiment.

Therefore, as shown in the flowchart of FIG. 2, a film forming method according to one embodiment includes a step of preparing a substrate (step ST1) and a step of forming a tungsten film on the substrate (step ST2). In step ST2, a chlorine-containing tungsten film whose film stress is adjusted by the chlorine concentration in the film is formed as at least a part of the tungsten film. By adjusting the chlorine concentration of the tungsten film, the tensile stress can be reduced more than that of a normal tungsten film, and a tungsten film whose tensile stress is reduced can be easily obtained.

For example, in the case of forming a tungsten film by a CVD method or an ALD method using a tungsten chloride gas and a reducing gas, the chlorine concentration in the film is generally about 2 at %, and the tensile stress of the film is a high value of 1700 to 1900 MPa when the film thickness is about 50 to 100 nm. On the other hand, increasing the chlorine concentration in the film can reduce the tensile stress. By setting the chlorine concentration in the film to 4 at % or higher, the tensile stress can be set to 500 MPa or lower, or the stress of the film can be set to a compressive stress.

Generally, a mechanism by which a tungsten film has a tensile stress can be explained by the model shown in FIGS. 3A to 3C. As shown in FIG. 3A, the size of a crystal lattice 211 of a tungsten crystal is smaller than the size of a crystal lattice 212 of a silicon crystal of a base. Therefore, when a tungsten film is formed on a silicon wafer as a substrate, as shown in FIG. 3B, the crystal lattice 211 of the tungsten is dragged by the crystal lattice 212 of the silicon and has a tensile stress. Therefore, as shown in FIG. 3C, a tungsten film 222 formed on a silicon wafer 221 has a tensile stress as a whole. Such a tendency does not change even when the film contains about 2 at % of chlorine as an impurity.

On the other hand, a mechanism, by which the tensile stress of the tungsten film containing a large amount of chlorine (for example, 4 at % or more) decreases and further becomes a compressive stress, can be explained by a model shown in FIGS. 4A to 4C. A crystal lattice 213 of a high-chlorine containing tungsten crystal containing a large amount of chlorine 214 is larger than the ordinary crystal lattice 211. Therefore, the size of the crystal lattice 213 approaches the size of the crystal lattice 212 of the silicon crystal, and in some cases, as shown in FIG. 4A, the size of the crystal lattice 213 of the tungsten crystal is larger than the size of the crystal lattice 212 of the silicon crystal. The tensile stress is relieved when the size of the crystal lattice 213 of the high-chlorine containing tungsten crystal approaches the size of the crystal lattice 212 of the silicon crystal. Further, when the crystal lattice 213 of the tungsten crystal becomes larger as shown in FIG. 4A, the crystal lattice 213 of the tungsten is dragged by the crystal lattice 212 of the silicon and has a compressive stress as shown in FIG. 4B. In this case, as shown in FIG. 4C, a high chlorine concentration tungsten film 223 formed on the silicon wafer 221 has a compressive stress as a whole.

Figure 5A:
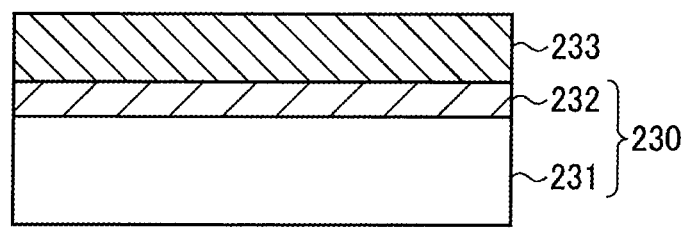
FIGS. 5A and 5B are cross-sectional views for explaining a method for manufacturing a tungsten film according to one embodiment.
Figure 5B:
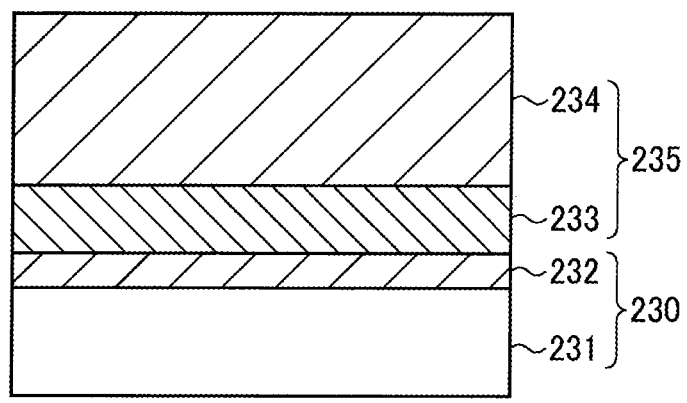

The tungsten film may be only the chlorine-containing tungsten film whose chlorine concentration is adjusted, as described above. However, a tungsten film with a high chlorine concentration (for example, 4 at % or more) is difficult to be formed on a silicon wafer or on a TiN film as a base film by a general CVD method or ALD method. Therefore, as shown in FIG. 5A, for example, an initial tungsten film 233 with a low chlorine concentration and a tensile stress is formed under normal conditions so that a chlorine-containing tungsten film with a high chlorine concentration can be formed on a substrate 230 in which a TiN film 232 is formed as a base film on a silicon base 231. Then, as shown in FIG. 5B, a chlorine-containing tungsten film 234 is formed on the initial tungsten film 233. A tungsten film 235 is composed of the initial tungsten film 233 and the chlorine-containing tungsten film 234. The film thickness of the TiN film 232 is preferably 0.1 nm or more, more preferably in the range of 0.5 to 10 nm. The film thickness of the initial tungsten film 233 is preferably 0.5 nm or more, more preferably in the range of 1 to 15 nm. By forming the initial tungsten film 233 in this way, the conditions under which the chlorine-containing tungsten film 234 can be formed can be expanded. Further, a tungsten film with a tensile stress may be additionally formed on the chlorine-containing tungsten film 234 under normal conditions.

As described above, when the chlorine-containing tungsten film has a compressive stress, a tungsten film obtained by laminating the chlorine-containing tungsten film and the tungsten film formed under normal conditions and having a tensile stress can relieve or offset the stress of the tungsten film with a tensile stress. Further, even when the chlorine-containing tungsten film has a low tensile stress, the stress of the entire film can be relieved.

Next, in a typical example of forming a tungsten film by a CVD method or an ALD method using a tungsten chloride gas and a reducing gas, an example of a method for obtaining a chlorine-containing tungsten film with a high chlorine concentration whose tensile stress can be reduced will be described.

The normal conditions for forming a tungsten film using a tungsten chloride gas and a reducing gas include a substrate temperature of 400° C. or higher and a flow rate of $H_2$ gas supplied as a reducing gas of 1000 to 10000 sccm ($H_2$ gas partial pressure of 3.73 to 21.36 Torr (497 to 2848 Pa)), and the tensile stress of the tungsten film formed under these conditions shows a high value of 1700 to 1900 MPa when the film thickness is about 50 to 100 nm. Further, the chlorine concentration in the film at this case is a low value of 2 at % or less.

On the other hand, by lowering the substrate temperature or reducing the $H_2$ gas flow rate (reducing the $H_2$ gas partial pressure), the chlorine concentration in the tungsten film can be adjusted to increase, and the stress in the film can be reduced. Specifically, by setting the substrate temperature to 380° C. or lower or the $H_2$ gas flow rate to 800 sccm ($H_2$ gas partial pressure of 3.03 Torr (404 Pa)) or lower, the chlorine concentration is made higher than that in the tungsten film under normal conditions, and the tensile stress of the film can be reduced. When the substrate temperature is 380° C. or lower, or the $H_2$ gas flow rate ($H_2$ gas partial pressure) is 800 sccm or less ($H_2$ gas partial pressure is 3.03 Torr (404 Pa) or less), the chlorine concentration in the film can be 4 at % or more. Furthermore, when the $H_2$ gas flow rate ($H_2$ gas partial pressure) is 500 sccm or less ($H_2$ gas partial pressure is 1.95 Torr (259 Pa) or less), the tensile stress of the film can be set to 500 MPa or less, or the film stress can be set to a compressive stress. Both lowering the substrate temperature and reducing the $H_2$ gas flow rate may be performed to increase the chlorine concentration in the tungsten film.

In Patent Document 1, it is disclosed that in the case of forming a tungsten film by a CVD method using $WF_6$ and a reducing gas, since the tensile stress increases when the substrate temperature drops to a low temperature of about 400° C., pretreatment is performed with a mixed gas in which $WF_6$ and monosilane are mixed at a predetermined ratio to reduce the tensile stress. However, the method of Patent Document 1 requires complicated processes, and there is concern that the fluorine contained in $WF_6$ may adversely affect the device, so a different approach is required.

In the present embodiment, when a tungsten film is formed on a substrate, a chlorine-containing tungsten film whose film stress is adjusted by adjusting the chlorine concentration in the film is used as at least a part of the tungsten film, a tungsten film with a low tensile stress can be easily obtained without pretreatment. In particular, since a tungsten film with a chlorine concentration of 4 at % or more has a tensile stress of 500 MPa or less or the stress of the film can become a compressive stress, the effect of reducing the stress of the entire tungsten film is large.

<Specific Embodiment>

Next, a specific embodiment of forming a tungsten film by an ALD method will be described.

(Example of Film Forming Apparatus)

Figure 6:
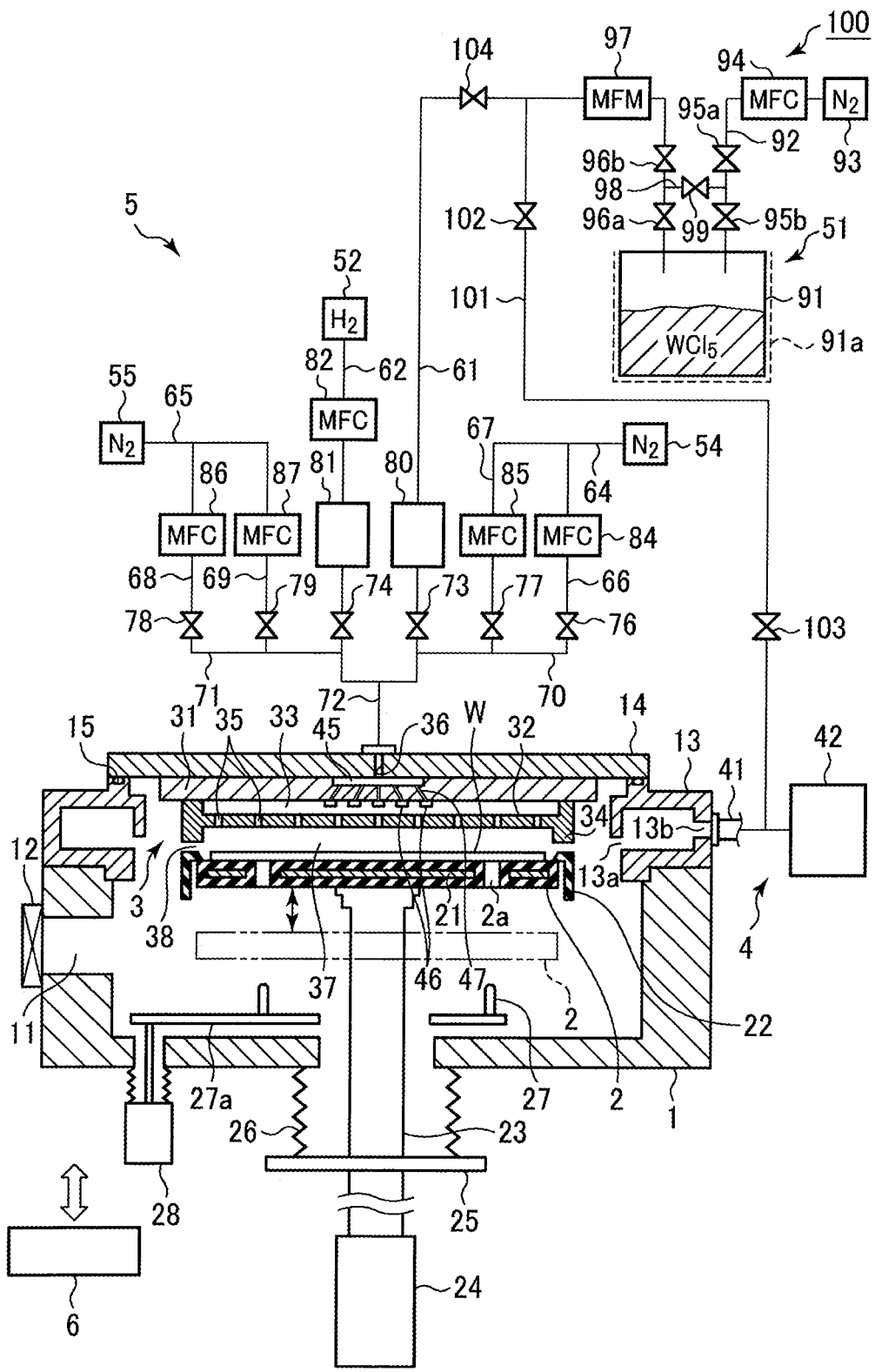
FIG. 6 is a cross-sectional view showing an example of a film forming apparatus used for forming a tungsten film.

FIG. 6 is a cross-sectional view showing an example of a film forming apparatus used when forming a tungsten film by an ALD method.

A film forming apparatus 100 includes a chamber 1, a susceptor 2 for horizontally supporting a semiconductor wafer (hereinafter, simply referred to as "wafer") W as a substrate within the chamber 1, a shower head 3 for supplying a processing gas into the chamber 1 in the form of a shower, an exhaust device 4 for exhausting the inside of the chamber 1, a processing gas supply mechanism 5 for supplying the processing gas to the shower head 3, and a controller 6.

The chamber 1 is made of metal such as aluminum or the like and has a substantially cylindrical shape. A loading/unloading port 11 for loading/unloading the wafer W is formed on the sidewall of the chamber 1, and the loading/unloading port 11 can be opened and closed by a gate valve 12. An annular exhaust duct 13 having a rectangular cross section is provided on the main body of the chamber 1. A slit 13a is formed along the inner peripheral surface of the exhaust duct 13. An exhaust port 13b is formed on the outer wall of the exhaust duct 13. A ceiling wall 14 is provided on the upper surface of the exhaust duct 13 so as to block the upper opening of the chamber 1. A space between the ceiling wall 14 and the exhaust duct 13 is airtightly sealed with a seal ring 15.

The susceptor 2 is disc-shaped and has a size corresponding to that of the wafer W, and is supported by a support member 23. The susceptor 2 is made of a ceramic material such as aluminum nitride (AlN) or a metal material such as aluminum or a nickel-based alloy, and a heater 21 for heating the wafer W is embedded therein. The heater 21 is powered by a heater power supply (not shown) to generate heat. By controlling the output of the heater 21 by a temperature signal from a thermocouple (not shown) provided near a wafer placing surface on the upper surface of the susceptor 2, the wafer W is controlled to a predetermined temperature.

The susceptor 2 is provided with an outer ring 22 made of ceramics such as alumina or the like so as to cover the outer peripheral region of the wafer placing surface and the side surface of the susceptor 2.

The support member 23 that supports the susceptor 2 extends downward from the chamber 1 through a hole formed in the bottom wall of the chamber 1 from the center of the bottom surface of the susceptor 2 and its lower end is connected to an elevating mechanism 24, so that the susceptor 2 can move up and down between a processing position shown in FIG. 6 and a transfer position at which the wafer can be transferred, which is located below the processing position and indicated by a dashed-dotted line, via the support member 23 by the elevating mechanism 24. Further, a flange portion 25 is attached to the lower portion of the support member 23 that is located below the chamber 1, and a bellows 26 is provided between the bottom surface of the chamber 1 and the flange portion 25 to separate the atmosphere in the chamber 1 from the outside air and expand and contract as the susceptor 2 moves up and down.

Three wafer support pins 27 (only two are shown) are provided near the bottom surface of the chamber 1 so as to protrude upward from an elevating plate 27a. The wafer support pins 27 can be moved up and down via the elevating plate 27a by an elevating mechanism 28 provided below the chamber 1, are inserted into through-holes 2a provided in the susceptor 2 at the transfer position, and can protrude from the upper surface of the susceptor 2. The wafer W is transferred between a wafer transfer mechanism (not shown) and the susceptor 2 by raising and lowering the wafer support pins 27 in this way.

The shower head 3 is made of metal, is provided so as to face the susceptor 2, and has approximately the same diameter as the susceptor 2. The shower head 3 has a main body 31 fixed to the ceiling wall 14 of the chamber 1 and a shower plate 32 connected to the bottom of the main body 31. A gas diffusion space 33 is formed between the main body 31 and the shower plate 32.

A plurality of distribution blocks 46 are provided in the gas diffusion space 33. A plurality of gas discharge holes are formed around the distribution blocks 46 and configured to distribute a gas. Each of the distribution blocks 46 is connected to one end of each of a plurality of gas supply paths 47 provided in the main body 31. The other end of each of the gas supply paths 47 is connected to a diffusion portion 45 formed in the central portion of the upper surface of the main body 31. Further, a gas introduction hole 36 penetrating from the upper surface of the ceiling wall 14 to the diffusion portion 45 is provided in the central portion of the ceiling wall 14.

An annular protrusion 34 protruding downward is formed at the peripheral edge of the shower plate 32, and gas discharge holes 35 are formed on the flat surface inside the annular protrusion 34 of the shower plate 32.

When the susceptor 2 is located at the processing position, a processing space 37 is formed between the shower plate 32 and the susceptor 2, and the annular protrusion 34 and the upper surface of the outer ring 22 of the susceptor 2 are adjacent to form an annular gap 38.

The exhaust device 4 includes an exhaust pipe 41 connected to the exhaust port 13b of the exhaust duct 13, and an exhaust mechanism 42 connected to the exhaust pipe 41 and having a vacuum pump, a pressure control valve (APC), or the like. During processing, the gas in the chamber 1 reaches the exhaust duct 13 through the slit 13a and is exhausted from the exhaust duct 13 through the exhaust pipe 41 by the exhaust mechanism 42 of the exhaust device 4.

The processing gas supply mechanism 5 includes a $WCl_5$ gas supply mechanism 51 for supplying $WCl_5$ gas as tungsten chloride which is a tungsten raw material gas, an $H_2$ gas supply source 52 for supplying $H_2$ gas as a reducing gas, and a first $N_2$ gas supply source 54 and a second $N_2$ gas supply source 55 for supplying $N_2$ gas which is a purge gas, and further includes a $WCl_5$ gas supply line 61 extending from the $WCl_5$ gas supply source 51, an $H_2$ gas supply line 62 extending from the $H_2$ gas supply source 52, a first $N_2$ gas supply line 64 extending from the first $N_2$ gas supply source 54 and supplying $N_2$ gas to the $WCl_5$ gas supply line 61 side, and a second $N_2$ gas supply line 65 extending from the second $N_2$ gas supply source 55 and supplying $N_2$ gas to the $H_2$ gas supply line 62 side. Tungsten chloride is not limited to $WCl_5$, and $WCl_4$ or $WCl_6$ may also be used.

The first $N_2$ gas supply line 64 branches into a first continuous $N_2$ gas supply line 66 that constantly supplies $N_2$ gas during film formation by an ALD method, and a first flash purge line 67 that supplies $N_2$ gas only during a purge process. The second $N_2$ gas supply line 65 branches into a second continuous $N_2$ gas supply line 68 that constantly supplies $N_2$ gas during film formation by an ALD method, and a second flash purge line 69 that supplies $N_2$ gas only during a purge process. The first continuous N$_2$ gas supply line 66 and the first flash purge line 67 are connected to a first connection line 70, and the first connection line 70 is connected to the WCl$_5$ gas supply line 61. The second continuous N$_2$ gas supply line 68 and the second flash purge line 69 are connected to a second connection line 71, and the second connection line 71 is connected to the H$_2$ gas supply line 62. The WCl$_5$ gas supply line 61 and the H$_2$ gas supply line 62 join to a joining pipe 72, and the joining pipe 72 is connected to the gas introduction hole 36 described above.

On/off valves 73, 74, 76, 77, 78, and 79 for switching gases during ALD are respectively provided on the most downstream side of the WCl$_5$ gas supply line 61, the H$_2$ gas supply line 62, the first continuous N$_2$ gas supply line 66, the first flash purge line 67, the second continuous N$_2$ gas supply line 68, and the second flash purge line 69. Further, mass flow controllers 82, 84, 85, 86, and 87 as flow rate controllers are respectively provided on the upstream side of the on/off valves of the H$_2$ gas supply line 62, the first continuous N$_2$ gas supply line 66, the first flash purge line 67, the second continuous N$_2$ gas supply line 68, and the second flash purge line 69. Further, the WCl$_5$ gas supply line 61 and the H$_2$ gas supply line 62 are provided with buffer tanks 80 and 81, respectively, so that necessary gas can be supplied in a short time.

The WCl$_5$ gas supply mechanism 51 has a film forming raw material tank 91 containing WCIs. WCl$_5$ is solid at room temperature, and solid WCl$_5$ is stored in the film forming raw material tank 91. A heater 91a is provided around the film forming raw material tank 91 to heat the film forming raw material in the film forming raw material tank 91 to an appropriate temperature to sublime WCIs. The WCl$_5$ gas supply line 61 described above is inserted into the film forming raw material tank 91 from above.

The WCl$_5$ gas supply mechanism 51 includes a carrier gas pipe 92 inserted from above into the film forming raw material tank 91, a carrier N$_2$ gas supply source 93 for supplying N$_2$ gas, which is a carrier gas, to the carrier gas pipe 92, a mass flow controller 94 as a flow rate controller and on/off valves 95a and 95b on the downstream side of the mass flow controller 94, which are connected to the carrier gas pipe 92, and on/off valves 96a and 96b and a mass flow meter 97 connected to the WCl$_5$ gas supply line 61 near the film forming raw material tank 91. On the carrier gas pipe 92, the on/off valve 95a is provided directly below the mass flow controller 94, and the on/off valve 95b is provided at the insertion end side of the carrier gas pipe 92. Further, the on/off valves 96a and 96b and the mass flow meter 97 are arranged in the order of the on/off valve 96a, the on/off valve 96b, and the mass flow meter 97 from the insertion end of the WCl$_5$ gas supply line 61.

A bypass pipe 98 is provided to connect a position between the on/off valve 95a and the on/off valve 95b of the carrier gas pipe 92 and a position between the on/off valve 96a and the on/off valve 96b of the WCl$_5$ gas supply line 61, and an on/off valve 99 is interposed in the bypass pipe 98. By closing the on/off valves 95b and 96a and opening the on/off valves 99, 95a, and 96b, N$_2$ gas from the carrier N$_2$ gas supply source 93 can be supplied to the WCl$_5$ gas supply line 61 through the carrier gas pipe 92 and the bypass pipe 98 to purge the WCl$_5$ gas supply line 61.

One end of an EVAC pipe 101 is connected to the downstream position of the mass flow meter 97 in the WCl$_5$ gas supply line 61, and the other end of the EVAC pipe 101 is connected to the exhaust pipe 41. On/off valves 102 and 103 are provided near the WCl$_5$ gas supply line 61 and near the exhaust pipe 41 of the EVAC pipe 101, respectively.

Further, an on/off valve 104 is provided at the downstream side of the connection position of the EVAC pipe 101 in the WCl$_5$ gas supply line 61. By opening the on/off valves 102, 103, 96a, and 96b while the on/off valves 104, 99, 95a, and 95b are closed, the inside of the film forming raw material tank 91 can be evacuated by the exhaust mechanism 42.

The controller 6 is composed of a computer, and has a main controller having a CPU, an input device, an output device, a display device, and a storage device (storage medium). The main controller controls, for example, the opening and closing of the valves, the flow rate of gas by the flow rate controller, the opening degree of the pressure control valve (APC), the output of the heater that heats the wafer W, and the like.

<Film Forming Method>

Next, a method for forming a tungsten film on the wafer W using the film forming apparatus shown in FIG. 6 will be described.

First, the wafer W, which is a substrate, is loaded into the chamber 1 through the loading/unloading port 11 and placed on the susceptor 2 heated to a predetermined temperature by the heater 21, and the susceptor 2 is raised to the processing position. Then, the inside of the chamber 1 is evacuated to a predetermined degree of vacuum, and the inside of the film forming raw material tank 91 is similarly evacuated through the EVAC pipe 101 by closing the on/off valves 104, 95a, 95b, and 99 and opening the on/off valves 102, 103, 96a, and 96b. Then, the on-off valve 76 and the on-off valve 78 are opened, the on-off valves 73, 74, 77, and 79 are closed, N$_2$ gas is supplied from the first N$_2$ gas supply source 54 and the second N$_2$ gas supply source 55 into the chamber 1 through the first continuous N$_2$ gas supply line 66 and the second continuous N$_2$ gas supply line 68 to increase the pressure, and the temperature of the wafer W on the susceptor 2 is stabilized.

After the inside of the chamber 1 reaches a predetermined pressure, the on-off valves 102 and 103 are closed and the on-off valves 104, 95a, and 95b are opened to raise the pressure in the film forming raw material tank 91 to make it possible to supply WCl$_5$ gas as a tungsten raw material.

In this state, WCl$_5$ gas which is a film forming raw material gas, H$_2$ gas which is a reducing gas, and N$_2$ gas which is a purge gas are sequentially supplied in the following manner to form a tungsten film.

First, while the on/off valve 76 and the on/off valve 78 are kept open, N$_2$ gas is continuously supplied from the first N$_2$ gas supply source 54 and the second N$_2$ gas supply source 55 through the first continuous N$_2$ gas supply line 66 and the second continuous N$_2$ gas supply line 68, and by opening the on/off valve 73, WCl$_5$ gas is supplied from the WCl$_5$ gas supply mechanism 51 to the processing space 37 in the chamber 1 through the WCl$_5$ gas supply line 61. At this time, WCl$_5$ gas is supplied into the chamber 1 after being temporarily stored in the buffer tank 80. As a result, WCl$_5$ gas is adsorbed on the surface of the wafer W.

Next, while continuing to supply N$_2$ gas through the first continuous N$_2$ gas supply line 66 and the second continuous N$_2$ gas supply line 68, the on/off valve 73 is closed to stop the supply of WCl$_5$ gas and the on/off valves 77 and 79 are opened to supply N$_2$ gas (flash purge N$_2$ gas) from the first flash purge line 67 and the second flash purge line 69 as well, thereby purging excessive WCl$_5$ gas or the like in the processing space 37 with a large flow of N$_2$ gas.

Next, the on/off valves 77 and 79 are closed to stop the supply of N$_2$ gas from the first flash purge line 67 and the second flash purge line 69, and while continuing to supply N$_2$ gas through the first continuous N$_2$ gas supply line 66 and the second continuous N₂ gas supply line 68, the on/off valve 74 is opened to supply H₂ gas as a reducing gas from the H₂ gas supply source 52 to the processing space 37 through the H₂ gas supply line 62. At this time, H₂ gas is supplied into the chamber 1 after being temporarily stored in the buffer tank 81. As a result, WCl₅ gas adsorbed on the wafer is reduced.

Next, while continuing to supply N₂ gas through the first continuous N₂ gas supply line 66 and the second continuous N₂ gas supply line 68, the on/off valve 74 is closed to stop the supply of H₂ gas from the H₂ gas supply line 62, and the on/off valves 77 and 79 are opened to supply N₂ gas (flash purge N₂ gas) from the first flash purge line 67 and the second flash purge line 69 as well, thereby purging excessive H₂ gas in the processing space 37 with a large flow of N₂ gas.

A thin tungsten unit film is formed by performing one cycle of the above steps in a short time, and a tungsten film having a predetermined film thickness is obtained by repeating the cycle of these steps a plurality of times.

For example, as shown in FIG. 5 described above, when the initial tungsten film 233 is formed on the substrate 230 and the chlorine-containing tungsten film 234 is formed thereon to form the tungsten film 235, the procedure is as follows.

As shown in FIG. 5A, a laminate in which the TiN film 232 as a base film is formed on the silicon base 231 is used as the substrate 230, and the initial tungsten film 233 is formed thereon by the ALD method of the procedure described above under normal conditions. The conditions in this case are as follows:

Pressure: 10 to 60 Torr (1333 to 7998 Pa)
Temperature: 400 to 600° C.
WCl₅ gas flow rate: 0.5 to 40 sccm
(Carrier gas flow rate: 100 to 5000 sccm)
H₂ gas flow rate: 1000 to 10000 sccm
(H₂ gas partial pressure: 3.73 to 21.36 Torr (497 to 2848 Pa))
N₂ gas flow rate of continuous supply: 10 to 5000 sccm
N₂ gas flow rate of flash purge: 500 to 5000 sccm
Raw material tank temperature: 50 to 200° C.

However, with regard to the H₂ gas partial pressure, in the case of film formation by the ALD method, the H₂ gas partial pressure for the entire ALD cycle is given.

Next, as shown in FIG. 5B, the chlorine-containing tungsten film 234 for stress adjustment is formed on the initial tungsten film 233 by the ALD method of the procedure described above. In this case, the chlorine concentration in the film is adjusted to increase by lowering the substrate temperature or reducing the H₂ gas flow rate compared to the above normal conditions. Specifically, the substrate temperature is set to 380° C. or lower, or the H₂ gas flow rate is set to 800 sccm or lower (H₂ gas partial pressure is set to 3.03 Torr (404 Pa) or lower), and the chlorine concentration in the film is set to 4 at % or higher.

Thus, by lowering the substrate temperature or reducing the H₂ gas flow rate (reducing the H₂ gas partial pressure), the chlorine concentration in the film increases and the tensile stress of the film can be reduced. In particular, by setting the substrate temperature to 380° C. or lower, or by setting the H₂ gas flow rate to 500 sccm or lower (H₂ gas partial pressure to 1.95 Torr (259 Pa) or lower), the tensile stress of the film can be set to 500 MPa or less, or the film stress can become a compressive stress.

Thus, when the chlorine-containing tungsten film 234 is laminated on the initial tungsten film 233 with a tensile stress formed under normal conditions, since the chlorine-containing tungsten film 234 has a low tensile stress, the stress of the entire tungsten film 235 can be relieved. Further, when the chlorine-containing tungsten film 234 has a compressive stress, the stress of the initial tungsten film 233 with a tensile stress can be relieved or offset.

<Experimental Example>

Next, an experimental example will be described.

Figure 7:
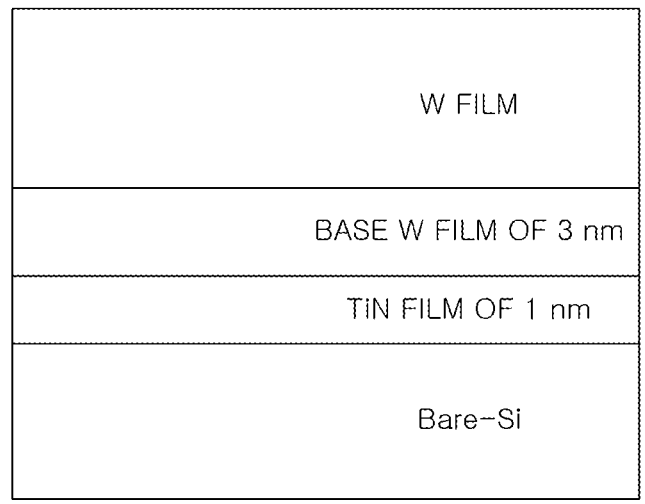
FIG. 7 is a diagram showing a structure of a sample used in an experimental example.
Figure 8A:
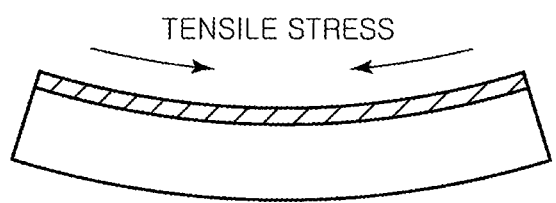
FIGS. 8A and 8B are diagrams for respectively explaining a tensile stress and a compressive stress of a film.
Figure 8B:
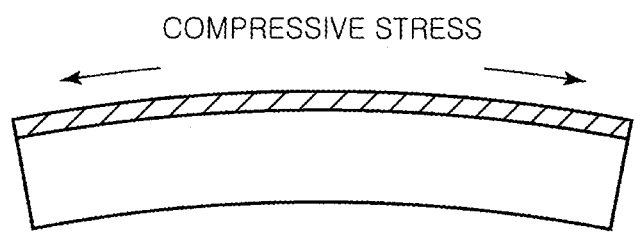

First, as shown in FIG. 7, after preparing a substrate in which a TiN film with a film thickness of 1 nm was formed on a base made of bare silicon and forming an initial tungsten film with a film thickness of 3 nm on the TiN film by the film forming apparatus of FIG. 6, a main tungsten film was formed thereon under various conditions and film thicknesses to prepare samples, and then, the film stress was measured. As for the film stress, the tensile stress is the stress shown in FIG. 8A, and the compressive stress is the stress shown in FIG. 8B. An initial tungsten film was formed using the conditions for the initial tungsten film shown above, and a tungsten film with a film thickness of 10 to 130 nm was formed thereon by changing the substrate temperature between 35° and 440° C. and changing the H₂ gas flow rate between 500 and 5000 sccm. The H₂ gas flow rate of 500 to 5000 sccm is 1.95 to 14.00 Torr (259 to 1867 Pa) when converted to the H₂ gas partial pressure.

Figure 9:
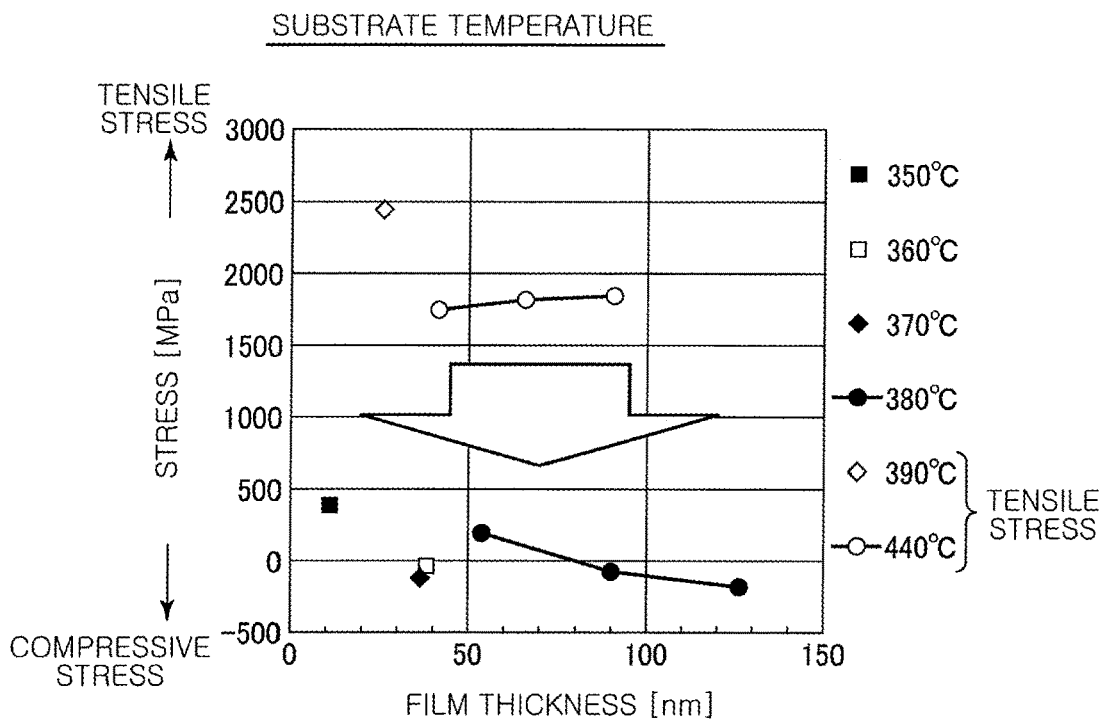
FIG. 9 is a diagram showing a relationship between a film thickness and a film stress in the case of changing a substrate temperature in the experimental example.

FIG. 9 is a diagram showing the relationship between a film thickness and a film stress when the substrate temperature is changed. As shown in FIG. 9, when the substrate temperature was 440° C., the film thickness was 40 to 90 nm and the film stress was 1700 to 1900 MPa, which was a large tensile stress. On the other hand, when the substrate temperature was 380° C. or less, the film thickness was 10 to 130 nm and the tensile stress was relieved to 500 MPa or less, and it was confirmed that as the film thickness increases, the stress changes to a compressive stress.

Figure 10:
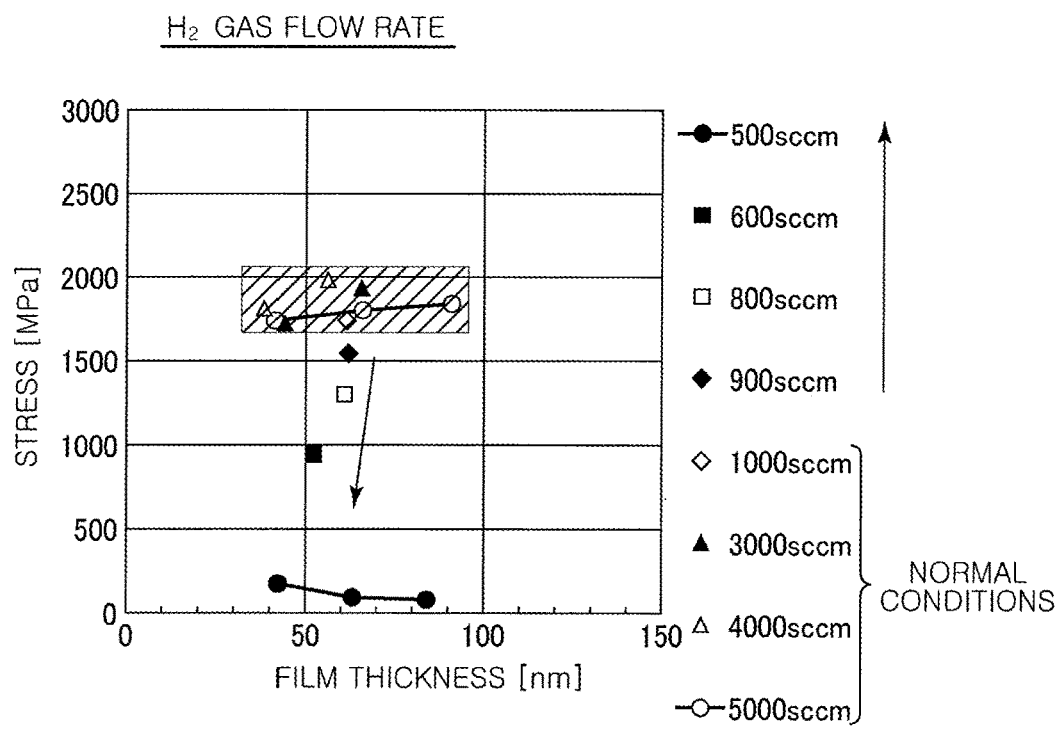
FIG. 10 is a diagram showing a relationship between a film thickness and a film stress in the case of changing an H2 gas flow rate (H2 gas partial pressure)

FIG. 10 is a diagram showing the relationship between a film thickness and a film stress when H₂ gas flow rate (H₂ gas partial pressure) is changed. As shown in FIG. 10, when the H₂ gas flow rate was 900 to 5000 sccm (H₂ gas partial pressure was 3.38 to 14.00 Torr (451 to 1867 Pa)), the film thickness was 40 to 90 nm, and the film stress was 1500 to 2000 Pa, which was a large tensile stress. On the other hand, it was confirmed that when the H₂ gas flow rate was 800 sccm (H₂ gas partial pressure was 3.03 Torr (404 Pa)), the tensile stress was relieved to 1300 MPa, and when the H₂ gas flow rate was 500 sccm (H₂ gas partial pressure was 1.95 Torr (259 Pa)), the tensile stress was relieved to 500 MPa or less.

Figure 11:
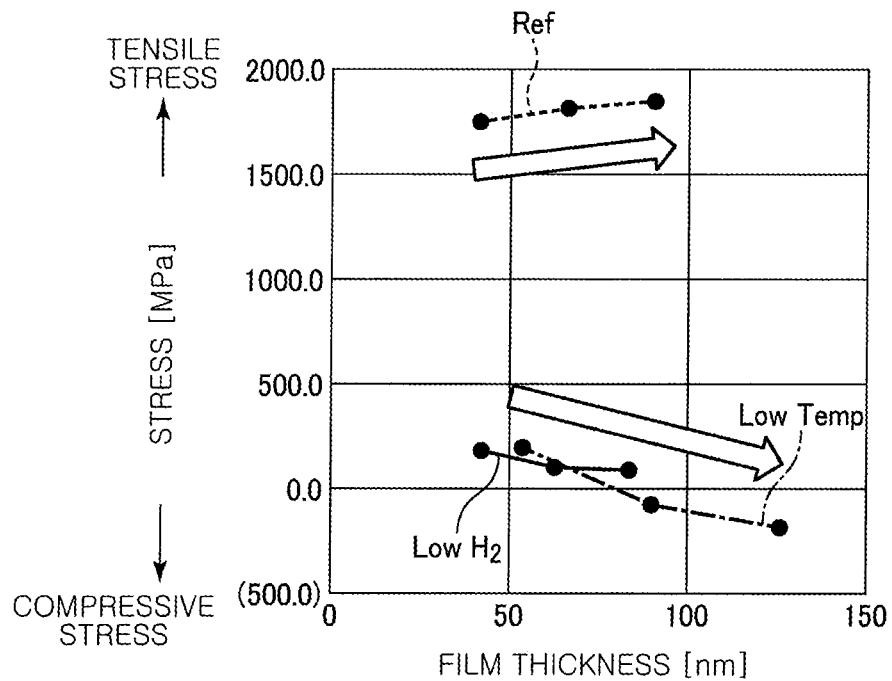
FIG. 11 is a diagram showing a relationship between a film thickness and a film stress in the case of forming tungsten films under Low Temp, Low H2, and normal conditions (Ref) in the experimental example.

Next, the substrate temperature of 380° C. (Low Temp) and the H₂ gas flow rate of 500 sccm (Low H₂) at which the film stress was small were further studied. FIG. 11 is a diagram showing the relationship between a film thickness and a film stress when tungsten films are formed under Low Temp, Low H₂, and normal conditions (Ref). As shown in FIG. 11, similar to the results of FIGS. 9 and 10, a large tensile stress of 1700 to 1900 MPa was obtained under Ref, whereas a tensile stress of 500 MPa or less, or an almost compressive stress in a region where the film thickness was thick, was obtained under Low Temp and Low H₂.

Figure 12A:
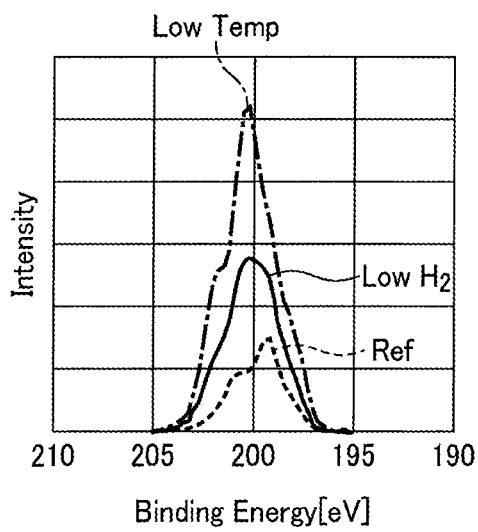
FIGS. 12A and 12B are diagrams showing results of measuring chlorine (Cl) concentrations of the films by X-ray photoelectron spectroscopy (XPS) for the tungsten films formed under Low Temp, Low H2, and Ref in the experimental example.
Figure 12B:
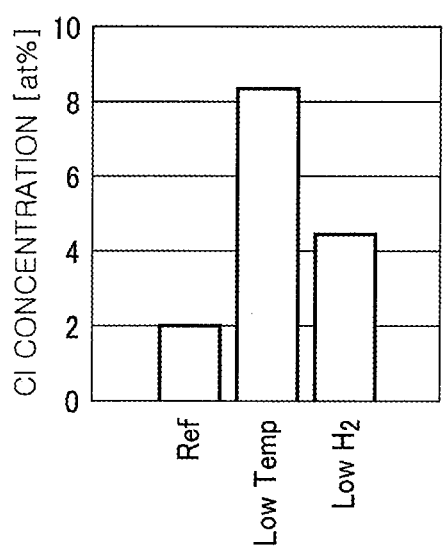

Chlorine (Cl) concentrations in the tungsten films formed under Low Temp, Low H₂, and Ref were measured by X-ray photoelectron spectroscopy (XPS). FIG. 12A is a diagram showing the XPS spectrum, and FIG. 12B is a diagram showing the chlorine concentration obtained from the XPS spectrum. As shown in these figures, it was confirmed that the tungsten films formed under Low Temp and Low H₂ whose film stresses are low have higher chlorine concentrations than that of the tungsten film formed under Ref, and the chlorine concentrations are 4 at % or more. In other words, it was confirmed that the decrease in the tensile stress corresponds to the increase in the chlorine concentration in the film, and that this tendency becomes significant when the chlorine concentration is 4 at % or more.

Figure 13A:
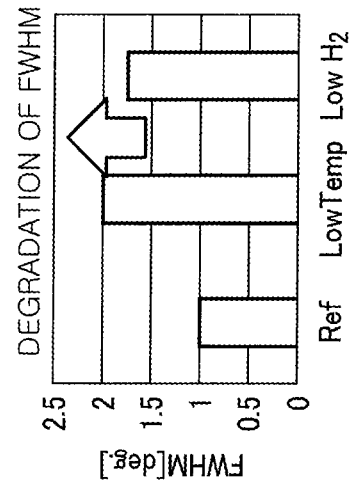
FIGS. 13A to 13C are diagrams showing results of X-ray diffraction (XRD) performed on the tungsten films formed under Low Temp, Low H2, and Ref in the experimental example.
Figure 13B:
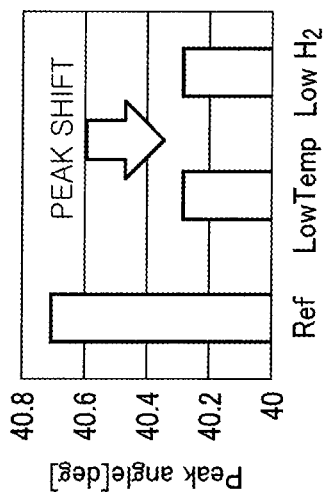
Figure 13C:
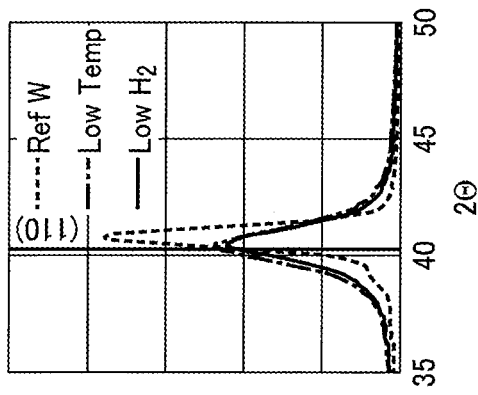

Next, X-ray diffraction (XRD) was performed on the tungsten films formed under Low Temp, Low $H_2$, and Ref. As a result, the diffraction intensities near the (110) plane were as shown in FIG. 13A. FIG. 13B shows the angle of the diffraction peak of the tungsten film on the (110) plane, and FIG. 13C shows the full width at half maximum (FWHM) of the diffraction peak of the tungsten film on the (110) plane. As shown in these figures, it can be seen that the diffraction peaks of the tungsten films formed under Low Temp and Low $H_2$ whose film stresses are low are shifted from the diffraction peak of the tungsten film formed under Ref, the peaks are broadened, and the FWHM is degraded. From this, it was confirmed that the size and arrangement of the crystal lattices of the tungsten films formed under Low Temp and Low $H_2$ are changed as the Cl concentration increases, and the stress is changed due to the mechanism of the model shown in FIGS. 3 and 4 described above.

<Other Applications>

Although the embodiments have been described above, the embodiments disclosed this time should be considered as examples and not restrictive in all respects. The above-described embodiments may be omitted, replaced, or modified in various ways without departing from the scope and spirit of the appended claims.

For example, in the above embodiments, the tungsten film is formed by the ALD method or the CVD method using tungsten chloride and a reducing gas, but the method for forming the tungsten film is not limited thereto.

Further, in the above embodiments, the semiconductor wafer is used as an example of the substrate, but the substrate is not limited to the semiconductor wafer, and other substrate such as a glass substrate and a ceramic substrate may be used.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A film forming method for forming a tungsten film, comprising:
   preparing a substrate; and
   forming a tungsten film on the substrate,
   wherein a chlorine-containing tungsten film whose film stress is adjusted by chlorine concentration in the film is formed as at least a part of the tungsten film, and
   wherein the chlorine-containing tungsten film has a chlorine concentration of 4 at % or more.

2. The film forming method of claim 1, wherein the chlorine-containing tungsten film has a tensile stress of 500 MPa or less or a compressive stress.

3. The film forming method of claim 1, wherein in said forming the tungsten film, an initial tungsten film with a chlorine concentration lower than a chlorine concentration of the chlorine-containing tungsten film is formed on the substrate and, then, the chlorine-containing tungsten film is formed on the initial tungsten film.

4. The film forming method of claim 3, wherein the initial tungsten film has a film thickness of 0.5 nm or more.

5. The film forming method of claim 4, wherein the substrate has a base and a TiN film formed on the base, and the initial tungsten film is formed on the TiN film.

6. A film forming method for forming a tungsten film, comprising:
   preparing a substrate; and
   forming a tungsten film on the substrate,
   wherein in said forming the tungsten film, the tungsten film is formed by a CVD method or an ALD method using tungsten chloride as a raw material gas and a reducing gas,
   a chlorine-containing tungsten film whose film stress is adjusted by a chlorine concentration in the film is formed as at least a part of the tungsten film, and
   wherein the chlorine-containing tungsten film has a chlorine concentration of 4 at % or more.

7. The film forming method of claim 6, wherein said forming the tungsten film is performed by the ALD method, and $H_2$ gas is used as the reducing gas.

8. The film forming method of claim 7, wherein when forming the chlorine-containing tungsten film, a partial pressure of $H_2$ gas is set to 404 Pa or less.

9. The film forming method of claim 8, wherein when forming the chlorine-containing tungsten film, the partial pressure of $H_2$ gas is set to 259 Pa or less and/or a substrate temperature is set to 380° C. or less.

10. The film forming method of claim 6, wherein the chlorine-containing tungsten film has a tensile stress of 500 MPa or less or a compressive stress.

11. The film forming method of claim 6, wherein in said forming the tungsten film, an initial tungsten film with a chlorine concentration lower than a chlorine concentration of the chlorine-containing tungsten film is formed on the substrate and, then, the chlorine-containing tungsten film is formed on the initial tungsten film.

12. The film forming method of claim 11, wherein the initial tungsten film is formed by the ALD method at a substrate temperature of 400° C. or higher and an $H_2$ gas partial pressure of 184 to 915 Pa.

13. The film forming method of claim 12, wherein the initial tungsten film has a film thickness of 0.5 nm or more.

14. The film forming method of claim 11, wherein the substrate has a base and a TiN film formed on the base, and the initial tungsten film is formed on the TiN film.

15. A tungsten film formed on a substrate, wherein at least a part of the tungsten film is a chlorine-containing tungsten film with a chlorine concentration of 4 at % or more, and
   wherein the chlorine-containing tungsten film has a tensile stress of 500 MPa or less or a compressive stress.

16. The tungsten film of claim 15, wherein the tungsten film includes an initial tungsten film formed on the substrate and having a chlorine concentration lower than a chlorine concentration of the chlorine-containing tungsten film, and the chlorine-containing tungsten film is formed on the initial tungsten film.

17. The tungsten film of claim 16, wherein the initial tungsten film has a film thickness of 0.5 nm or more.

* * * * *